United States Patent
Bauduin et al.

(10) Patent No.: US 12,219,733 B2
(45) Date of Patent: Feb. 4, 2025

(54) METHOD FOR ASSEMBLING A LIQUID COOLING ASSEMBLY OF A FAMILY OF LIQUID COOLING ASSEMBLIES

(71) Applicant: OVH, Roubaix (FR)

(72) Inventors: Hadrien Bauduin, Villeneuve d'Ascq (FR); Ali Chehade, Moncheaux (FR); Alexandre Alain Jean-Pierre Meneboo, Harnes (FR)

(73) Assignee: OVH, Roubaix (FR)

( * ) Notice: Subject to any disclaimer, the term of this patent is extended or adjusted under 35 U.S.C. 154(b) by 252 days.

(21) Appl. No.: 17/992,752

(22) Filed: Nov. 22, 2022

(65) Prior Publication Data
US 2023/0171925 A1    Jun. 1, 2023

(30) Foreign Application Priority Data

Nov. 29, 2021   (EP) ..................................... 21306655
Aug. 30, 2022   (EP) ..................................... 22306283

(51) Int. Cl.
*B21D 53/02*       (2006.01)
*F28D 1/03*        (2006.01)
(Continued)

(52) U.S. Cl.
CPC ......... *H05K 7/20254* (2013.01); *B21D 53/02* (2013.01); *F28D 1/0308* (2013.01);
(Continued)

(58) Field of Classification Search
CPC ........... H05K 7/20218; H05K 7/20254; H05K 7/2039; H05K 7/20509; H05K 7/20536;
(Continued)

(56) References Cited

U.S. PATENT DOCUMENTS 6,664,627 B2   12/2003   Cheon
7,077,189 B1   7/2006    Reyzin et al.
(Continued)

FOREIGN PATENT DOCUMENTS

| CN | 201156860 Y | 11/2008 |
|---|---|---|
| EP | 3620741 A1 | 3/2020 |
| GB | 2449951 | 12/2008 |

OTHER PUBLICATIONS

Attia, "Experimental investigation of vapor chamber with different working fluids at different charge ratios", Ain Shams Engineering Journal, (2012) 3, retrieved on Aug. 2, 2021 from https://www.sciencedirect.com/science/article/pii/S2090447912000147, pp. 289-297.

(Continued)

*Primary Examiner* — Zachary Pape
*Assistant Examiner* — Steven Ngo
(74) *Attorney, Agent, or Firm* — BCF LLP

(57) ABSTRACT

A method for assembling a liquid cooling assembly includes: providing liquid cooling blocks each defining an internal fluid conduit; providing a first heat spreading base defining at least one first pocket; and providing a second heat spreading base defining second pockets, a number of second pockets being greater than a number of the at least one first pocket. When assembling a first liquid cooling assembly: at least one liquid cooling block is selected to mate with the first heat spreading base; and the selected at least one liquid cooling block is inserted at least partly into a corresponding one of the at least one first pocket. When assembling a second liquid cooling assembly: at least two liquid cooling blocks are selected to mate with the second heat spreading base; and the selected at least two liquid cooling blocks are inserted at least partly into corresponding ones of the second pockets.

15 Claims, 6 Drawing Sheets

(51) Int. Cl.
*F28D 9/00* (2006.01)
*H01L 23/473* (2006.01)
*H05K 7/20* (2006.01)
*H01L 23/40* (2006.01)

(52) U.S. Cl.
CPC .......... *F28D 9/0043* (2013.01); *H01L 23/473* (2013.01); *H05K 7/20327* (2013.01); *H05K 7/20336* (2013.01); *H05K 7/20509* (2013.01); *F28F 2280/06* (2013.01); *H01L 2023/4068* (2013.01)

(58) Field of Classification Search
CPC ........... H05K 7/20627; H05K 7/20636; H05K 7/20709; H05K 7/20763; H05K 7/20772; H01L 23/36; H01L 23/367; H01L 23/3675; H01L 23/40; H01L 23/4006; H01L 23/46; H01L 23/473; H01L 2023/4037; H01L 2023/4043; H01L 2023/405; H01L 2023/4068; F28D 1/03; F28D 1/0308; F28D 9/0043; F28F 2280/06
See application file for complete search history.

(56) References Cited

U.S. PATENT DOCUMENTS

| | | | |
|---|---|---|---|
| 7,661,463 B2 | 2/2010 | Liu | |
| 10,136,552 B2 | 11/2018 | Zheng et al. | |
| 10,327,355 B2 | 6/2019 | Lin | |
| 10,809,776 B2 | 10/2020 | Lee | |
| 10,932,391 B2 | 2/2021 | Tsai | |
| 11,800,682 B2 * | 10/2023 | Lunsman | H01L 23/473 |
| 2008/0264608 A1 | 10/2008 | Tye et al. | |
| 2009/0065178 A1 | 3/2009 | Kasezawa et al. | |
| 2009/0151905 A1 | 6/2009 | Lai et al. | |
| 2013/0168068 A1 | 7/2013 | Huang et al. | |
| 2016/0061364 A1 * | 3/2016 | Brunschwiler | F16L 37/138 285/308 |
| 2017/0115071 A1 | 4/2017 | Lin | |
| 2019/0234691 A1 | 8/2019 | Lin | |
| 2020/0373223 A1 * | 11/2020 | Chehade | F28D 9/0031 |
| 2021/0164738 A1 | 6/2021 | Klaba et al. | |
| 2021/0378147 A1 * | 12/2021 | Chehade | H05K 7/20927 |
| 2022/0071056 A1 * | 3/2022 | Lin | H01L 23/473 |
| 2023/0189488 A1 * | 6/2023 | Chehade | H05K 7/20645 165/80.4 |

OTHER PUBLICATIONS

Jiang, "3D Heat Transfer Analysis of a Miniature Copper-Water Vapor Chamber with Wicked Pillars Array", Research Article, Hindawi Publishing Corporation, retrieved on Aug. 2, 2021 from https://www.hindawi.com/journals/isrn/2013/194908/, pp. 1-10.

English Abstract for CN201156860 retrieved on Espacenet on Nov. 21, 2022.

Extended European Search Report with regard to EP21306655.8 completed May 24, 2022.

"50×50×15mm Pure Copper Base", 50×50×15mm Pure Copper Base Water Cooling Block Waterblock for CPU Cooler, EBAY, https://www.ebay.com/itm/50x50x15mm-Pure-Copper-Base-Water-Cooling-Block-Waterblock-for-CPU-Cooler-/223271358240?_ul=IL, provided Jul. 21, 2021, pdf 4 pages.

"GPU Water Block Water Cooling Cooler Base", Amazon, https://www.amazon.com/Cooling-Cooler-Copper-Waterway-Component/dp/B07KZVQMNC, provided Jul. 21, 2021, 8 pages.

"Aveks CPU Water Cooling Block Waterblock", Aveks CPU Water Cooling Block Waterblock 50mm Copper Base, Amazon, https://www.amazon.com/Water-Cooling-Waterblock-Copper-Channel/dp/B013JD2CVO, provided Jul. 21, 2021, 10 pages.

"Bewinner PC Water Cooling Block", Amazon, https://www.amazon.com/Bewinner-Waterblock-Processed-Anti-Oxidization-Technology/dp/B07TMZQ56R, provided Jul. 21, 2021, 8 pages.

"Water Cooling Block, Richer-R Mini South Bridge", Amazon, https://www.amazon.com/Richer-R-Computer-4-4-5-8CM-4-4-5-8cm-Mainboard/dp/B07DCKHXBY, provided Jul. 21, 2021, 7 pages.

* cited by examiner

METHOD FOR ASSEMBLING A LIQUID COOLING ASSEMBLY OF A FAMILY OF LIQUID COOLING ASSEMBLIES

CROSS-REFERENCE

The present application claims priority from European Patent Application No. 21306655.8, filed on Nov. 29, 2021, and from European Patent Application No. 22306283.7, filed on Aug. 30, 2022, the entirety of both of which being incorporated by reference herein.

FIELD OF TECHNOLOGY

The present technology relates to liquid cooling assemblies and methods and systems for assembly thereof.

BACKGROUND

Heat dissipation is an important consideration for computer systems. Notably, many components of a computer system, such as a processor (also referred to as central processing unit (CPU)), generate heat and thus require cooling to avoid performance degradation and, in some cases, failure. Similar considerations arise for systems other than computer systems (e.g., power management systems). Thus, in many cases, different types of cooling solutions are implemented to promote heat dissipation from heat-generating electronic components, with the objective being to collect and conduct thermal energy away from these heat-generating electronic components. For instance, in a data center, in which multiple electronic systems (e.g., servers, networking equipment, power equipment) are continuously operating and generating heat, such cooling solutions may be particularly important.

One example of a cooling solution is a heat sink which relies on a heat transfer medium (e.g., a gas or liquid) to carry away the heat generated by a heat-generating electronic component. For instance, a liquid cooling block (sometimes referred to as a "water block"), which is a liquid cooling heat sink, can be thermally coupled to a heat-generating electronic component and water (or other liquid) is made to flow through a conduit in the liquid cooling block to absorb heat from the heat-generating electronic component. As water flows out of the liquid cooling block, so does the thermal energy collected thereby.

However, in cases in which different types of heat-generating electronic components have to be cooled such as in a data center, multiple models of liquid cooling blocks may need to be implemented, each being adapted to be mounted atop a particular type of heat-generating electronic component (e.g., different CPU models) since the heat-generating electronic components can have different sizes. However, producing a variety of liquid cooling blocks can be expensive, particularly in a setting where a multitude of different heat-generating electronic components of each type may need to be cooled such as in a data center, since each liquid cooling block model requires its own supply and manufacturing chain.

Furthermore, some CPUs are being designed to be smaller and are thus more power dense, thereby producing more heat per unit surface area. This can make heat absorption by a liquid cooling block mounted thereon less efficient.

There is therefore a desire for a liquid cooling assembly which can alleviate at least some of these drawbacks.

SUMMARY

It is an object of the present technology to ameliorate at least some of the inconveniences present in the prior art.

According to one aspect of the present technology, there is provided a method for assembling a liquid cooling assembly of a family of liquid cooling assemblies, including at least a first liquid cooling assembly and a second liquid cooling assembly, the method comprising: providing a plurality of liquid cooling blocks, each of the liquid cooling blocks defining an internal fluid conduit for circulation of cooling fluid therethrough, each of the liquid cooling blocks having a block thermal contact surface, the block thermal contact surface of each of the liquid cooling blocks having a same surface area; providing a first heat spreading base having a first thermal contact surface on a lower side of the first heat spreading base, the first thermal contact surface being configured to be in thermal contact with a first heat-generating electronic component, the first heat spreading base defining at least one first pocket on an upper side thereof; providing a second heat spreading base having a second thermal contact surface on a lower side of the second heat spreading base, the second thermal contact surface being configured to be in thermal contact with a second heat-generating electronic component, the second heat spreading base defining a plurality of second pockets on an upper side thereof, the second thermal contact surface having a surface area that is greater than a surface area of the first thermal contact surface such that the first and second thermal contact surfaces are adapted to be mounted on the first and second heat-generating electronic components respectively, a number of the second pockets being greater than a number of the at least one first pocket; when assembling the first liquid cooling assembly: selecting at least one liquid cooling block of the plurality of liquid cooling blocks to mate with the first heat spreading base in order to form the first liquid cooling assembly suitable for cooling the first heat-generating electronic component; inserting the selected at least one liquid cooling block at least partly into a corresponding one of the at least one first pocket of the first heat spreading base; the block thermal contact surface of each of the selected at least one liquid cooling block being in contact with an upper base surface of the first heat spreading base defining a corresponding one of the at least one first pocket; when assembling the second liquid cooling assembly: selecting at least two liquid cooling blocks of the plurality of liquid cooling blocks to mate with the second heat spreading base in order to form the second liquid cooling assembly suitable for cooling the second heat-generating component; inserting the selected at least two liquid cooling blocks at least partly into corresponding ones of the second pockets of the second heat spreading base; the block thermal contact surface of each of the selected at least two liquid cooling blocks being in contact with an upper base surface of the second heat spreading base defining a corresponding one of the second pockets.

In some embodiments, each of the liquid cooling blocks has a lower portion defining the block thermal contact surface thereof; when assembling the first liquid cooling assembly, inserting the selected at least one liquid cooling block comprises inserting the lower portion of the selected at least one liquid cooling block into the at least one first pocket; and when assembling the second liquid cooling assembly, inserting the selected at least two liquid cooling blocks comprises inserting the lower portions of the selected at least two liquid cooling blocks into the second pockets.

In some embodiments, the method further comprises: when assembling the first liquid cooling assembly, applying a thermal interface material on at least one of: (i) each upper base surface defining the at least one first pocket of the first heat spreading base, and (ii) the block thermal contact surface of each of the selected at least one liquid cooling block; and when assembling the second cooling assembly, applying a thermal interface material on at least one of: (i) each upper base surface defining a corresponding one of the second pockets of the second heat spreading base, and (ii) the block thermal contact surface of each of the selected at least two liquid cooling blocks.

In some embodiments, the at least one first pocket and the second pockets are sized to closely fit part of each of the liquid cooling blocks.

In some embodiments, the first heat spreading base is generally square; and the second heat spreading base is generally rectangular.

In some embodiments, the at least one first pocket is a single first pocket.

In some embodiments, the plurality of second pockets is two second pockets.

In some embodiments, the liquid cooling blocks are identical to one another.

In some embodiments, each liquid cooling block comprises a base and a cover connected thereto, the internal fluid conduit of each liquid cooling block being defined between the base and the cover thereof.

In some embodiments, the surface area of the second thermal contact surface is at least two times greater than the surface area of the first thermal contact surface.

According to another aspect of the present technology, there is provided a system for assembling a liquid cooling assembly of a family of liquid cooling assemblies, including at least a first liquid cooling assembly and a second liquid cooling assembly, the system comprising: a plurality of liquid cooling blocks, each of the liquid cooling blocks defining an internal fluid conduit for circulation of cooling liquid therethrough, each of the liquid cooling blocks having a block thermal contact surface, the block thermal contact surfaces of the liquid cooling blocks having a same surface area; a first heat spreading base having a first thermal contact surface on a lower side of the first heat spreading base, the first thermal contact surface being configured to be in thermal contact with a first heat-generating electronic component, the first heat spreading base defining at least one first pocket on an upper side thereof; a second heat spreading base having a second thermal contact surface on a lower side of the second heat spreading base, the second thermal contact surface being configured to be in thermal contact with a second heat-generating electronic component, the second heat spreading base defining a plurality of second pockets on an upper side thereof, the second thermal contact surface having a surface area that is greater than a surface area of the first thermal contact surface such that the first and second thermal contact surfaces are adapted to be mounted on the first and second heat-generating electronic components respectively, a number of the second pockets being greater than a number of the at least one first pocket; wherein, when the first liquid cooling assembly is assembled: at least one liquid cooling block of the plurality of liquid cooling blocks is at least partly received within a respective one of the at least one first pocket defined by the first heat spreading base; and the block thermal contact surface of each of the at least one liquid cooling block is in thermal contact with an upper base surface of the first heat spreading base defining a corresponding one of the at least one first pocket; wherein, when the second liquid cooling assembly is assembled: at least two liquid cooling blocks of the plurality of liquid cooling blocks are at least partly received within respective ones of the second pockets defined by the second heat spreading base; and the block thermal contact surface of each of the at least two liquid cooling blocks is in thermal contact with an upper base surface of the second heat spreading base defining a corresponding one of the second pockets.

In some embodiments, each of the liquid cooling blocks comprises a lower portion defining the block thermal contact surface thereof and an upper portion, a periphery of the lower portion being smaller than a periphery of the upper portion; when the first liquid cooling assembly is assembled, the lower portion of each of the at least one liquid cooling block is received in the respective one of the at least one first pocket; and when the second liquid cooling assembly is assembled, the lower portion of each of the at least two liquid cooling blocks is received within a respective one of the second pockets.

In some embodiments, the at least one first pocket and the second pockets are sized to closely fit part of each of the liquid cooling blocks.

In some embodiments, the at least one first pocket is a single first pocket.

In some embodiments, the surface area of the second thermal contact surface is at least two times greater than the surface area of the first thermal contact surface.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

It is to be understood that terms relating to the position and/or orientation of components such as "upper", "lower", "top", "bottom", "front", "rear", "left", "right", are used herein to simplify the description and are not intended to be limitative of the particular position/orientation of the components in use.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
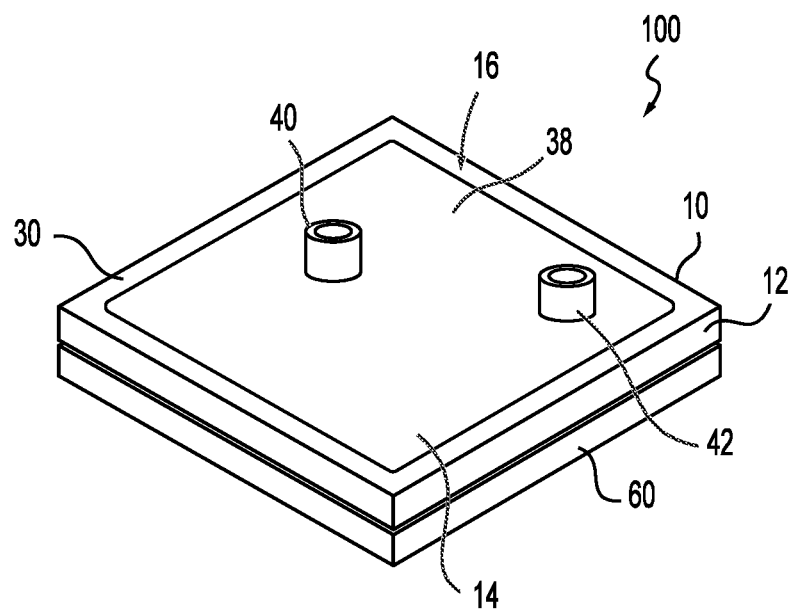
FIG. 1 is a perspective view, taken from a top, front, right side, of a liquid cooling assembly according to an embodiment of the present technology.
Figure 8:
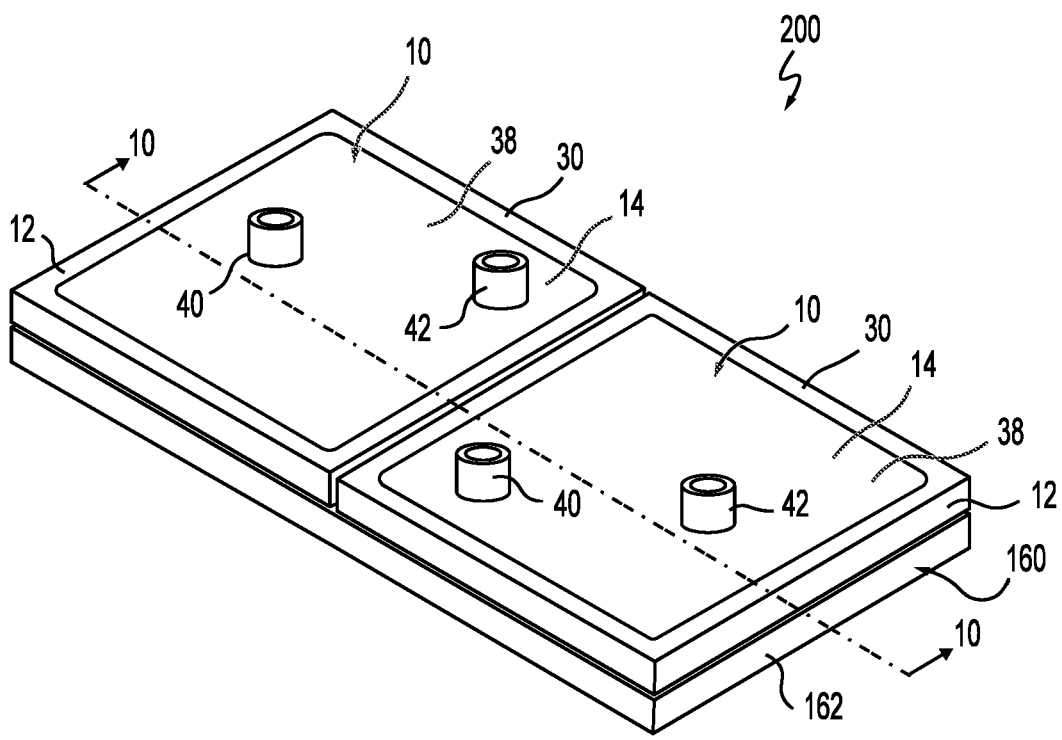
FIG. 8 is a perspective view, taken from a top, front, right side, of another liquid cooling assembly of a same family of the liquid cooling assembly of FIG. 1.
Figure 9:
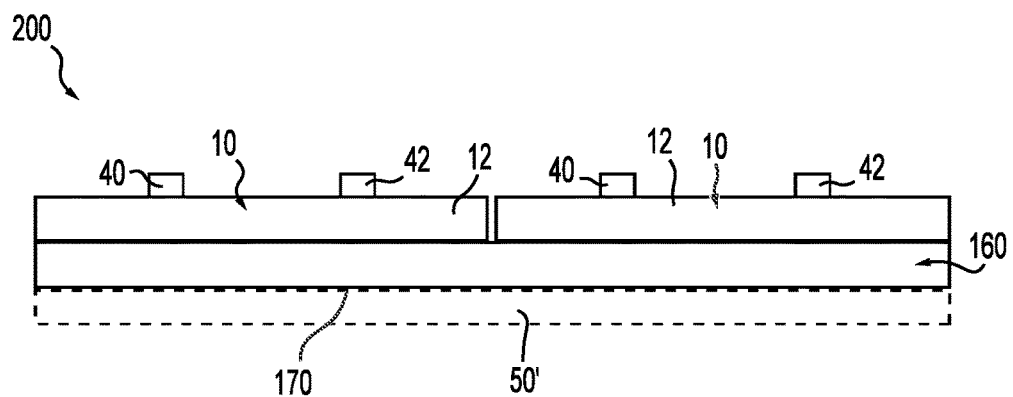
FIG. 9 is a front elevation view of the liquid cooling assembly of FIG. 8.

FIGS. 1 and 8 illustrate two different liquid cooling assemblies 100, 200 in accordance with an embodiment of the present technology. The liquid cooling assemblies 100, 200 are configured for cooling respective heat-generating electronic components 50, 50' (illustrated in FIGS. 2 and 9 respectively). In this example, each of the heat-generating electronic components 50, 50' is a central processing unit (CPU). For instance, each heat-generating electronic component 50, 50' may be part of a respective server operating within a data center. In use, the heat-generating electronic components 50, 50' generate a significant amount of heat and, as is known, can benefit from cooling. It is contemplated that each of the heat-generating electronic components 50, 50' could be any other suitable heat-generating electronic component (e.g., a graphics processing unit (GPU)). The heat-generating electronic components 50, 50' may be different types of heat-generating electronic components from one another (e.g., a CPU and a GPU respectively).

As will be described in detail below, the liquid cooling assemblies 100, 200 are part of a same family of liquid cooling assemblies. Notably, each liquid cooling assembly 100, 200 of the family of liquid cooling assemblies includes a common model of liquid cooling block 10 having an internal fluid conduit to circulate a cooling fluid therethrough. In other words, the liquid cooling block 10 can be used in the assembly of either of the liquid cooling assemblies 100, 200. This may allow the liquid cooling assemblies 100, 200 of the same family to be used for cooling different heat-generating electronic components 50, 50' without having to produce a different model of liquid cooling block altogether to accommodate either one of the heat-generating electronic components 50, 50'.

The liquid cooling block 10 will now be described with reference to FIGS. 1 to 3 and 5 to 7 in which the liquid cooling block 10 is illustrated forming part of the liquid cooling assembly 100.

Figure 5:
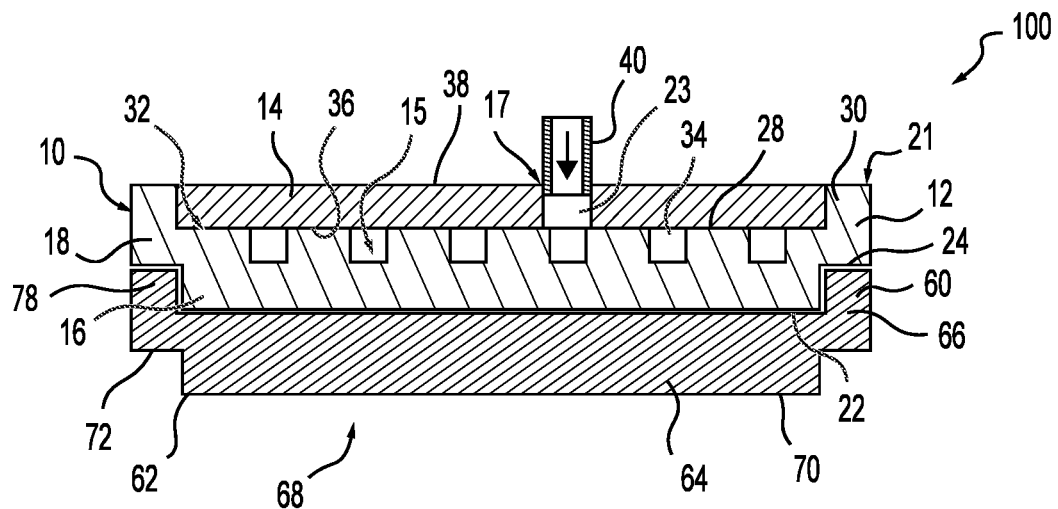
FIG. 5 is a cross-sectional view of the liquid cooling assembly of FIG. 1 taken along line 5-5 in FIG. 3.

As best shown in FIG. 5, the liquid cooling block 10 has a base 12 and a cover 14 which are connected to one another to form the liquid cooling block 10. In particular, together, the base 12 and the cover 14 define an internal fluid conduit 15 (schematically illustrated in FIG. 5) within which a cooling fluid is circulated to absorb heat from the heat-generating electronic component (50 or 50'). The internal fluid conduit 15 extends from an inlet 17 to an outlet 19 of the liquid cooling block 10. In this embodiment, the cooling fluid circulated through the internal fluid conduit 15 is demineralized water. However, the cooling fluid may be any other suitable cooling fluid (e.g., a refrigerant) in other embodiments. In some embodiments, the cooling fluid may be capable of two-phase flow such that the cooling fluid can change phases from liquid to gas and vice-versa based on a temperature thereof. The cooling fluid circulating within the liquid cooling block 10 will thus, at some point, be in the liquid phase, however the cooling fluid may not necessarily be in liquid phase throughout (e.g., the cooling fluid may evaporate from liquid to gas when its temperature reaches a certain value).

Figure 7:
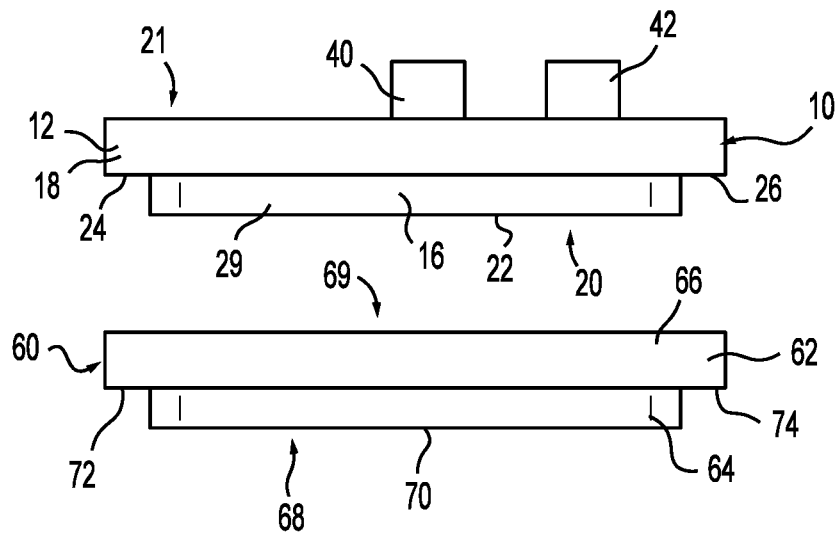
FIG. 7 is a right side elevation view of the liquid cooling assembly of FIG. 1 shown in the partially exploded configuration.

As best shown in FIG. 7, the base 12 has a lower portion 16 and an upper portion 18 disposed above the lower portion 16. The lower portion 16 has a periphery that is smaller than a periphery of the upper portion 18 and, as such, the upper portion 18 forms a peripheral shoulder 24 that extends outwardly from an upper end of the lower portion 16. The peripheral shoulder 24 defines a shoulder surface 26 on a lower side 20 of the base 12. The lower portion 16 is also positioned generally centrally relative to the upper portion 18. In this embodiment, the lower portion 16 is generally square and thus has four outer surfaces 29, one of which is shown in FIG. 7.

The lower portion 16 defines a thermal contact surface 22 of the liquid cooling block 10, the thermal contact surface 22 being disposed on the lower side 20 of the base 12. The thermal contact surface 22 is the surface of the base 12 through which heat is primarily transferred to the liquid cooling block 10. As such, in use, the thermal contact surface 22 is placed in thermal contact with another surface from which heat is to be absorbed. The thermal contact surface 22 is parallel to the shoulder surface 26 and is offset therefrom in a height direction of the liquid cooling block 10, the height direction of the liquid cooling block 10 being normal to the thermal contact surface 22.

With reference to FIG. 5, the upper portion 18 of the base 12 defines an upper base surface 28 disposed on and accessible from an upper side 21 of the base 12. The upper portion 18 also includes a retaining lip section 30 which extends upward from the upper base surface 28 and is disposed peripherally around the upper base surface 28. As such, a pocket 32 is defined by the upper base surface 28 and the retaining lip section 30. The pocket 32 is shaped and dimensioned to at least partly receive the cover 14 therein. Notably, in this embodiment, the pocket 32 is generally square as defined by the square shape of the retaining lip section 30.

As shown in FIG. 5, in this embodiment, the upper base surface 28 defines a channel 34 that forms in part the internal fluid conduit 15 of the liquid cooling block 10. Notably, the channel 34 establishes a path of the internal fluid conduit 15 and thus guides the cooling fluid circulating therein through the liquid cooling block 10 from the inlet 17 to the outlet 19 of the liquid cooling block 10. The channel 34 may have any suitable shape in different embodiments. For instance, the channel 34 may be shaped to define in part a serpentine path from the inlet 17 to the outlet 19. Examples of different shapes that the channel 34 could have are described in greater detail in European Patent Application 18315027.5, filed Sep. 4, 2018, the entirety of which is incorporated by reference herein.

In this embodiment, the base 12 is a single-piece component made integrally such that the base 12 is formed from a continuous material. As such, the base 12 may also be referred to as a "base body".

Figure 12:
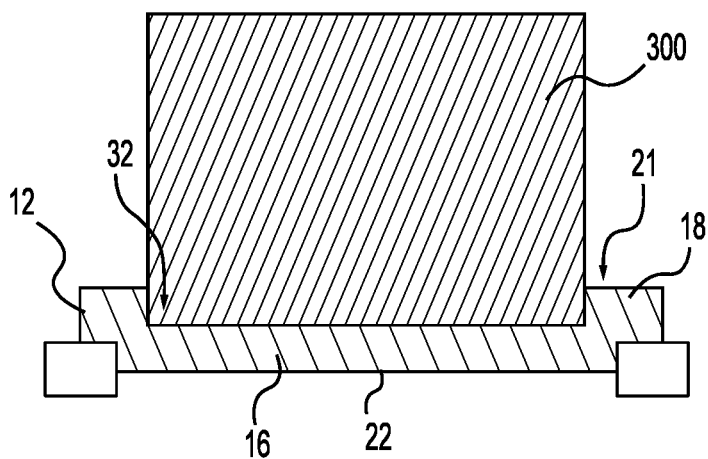
FIG. 12 is a cross-sectional view of a base of a liquid cooling block of the liquid cooling assembly of FIG. 1 while the base is being formed via a punching process according to an embodiment of the present technology.

In particular, with reference to FIG. 12, in this embodiment, the base 12 is formed at least in part by punching. More specifically, a punch 300 is pressed onto the material of the base 12 from the upper side 21 which, in an initial condition, is a flat plate member. As such, the punch 300 deforms the material of the flat plate member to form the above-described shape of the base 12, namely including the lower portion 16, the upper portion 18 and the pocket 32. Forming the base 12 by punching can be cost-efficient, particularly when repeatably producing many such components, and notably because the height of the raw flat plate member is lower than the height of the formed base 12. The base 12 may be formed differently in other embodiments.

Figure 3:
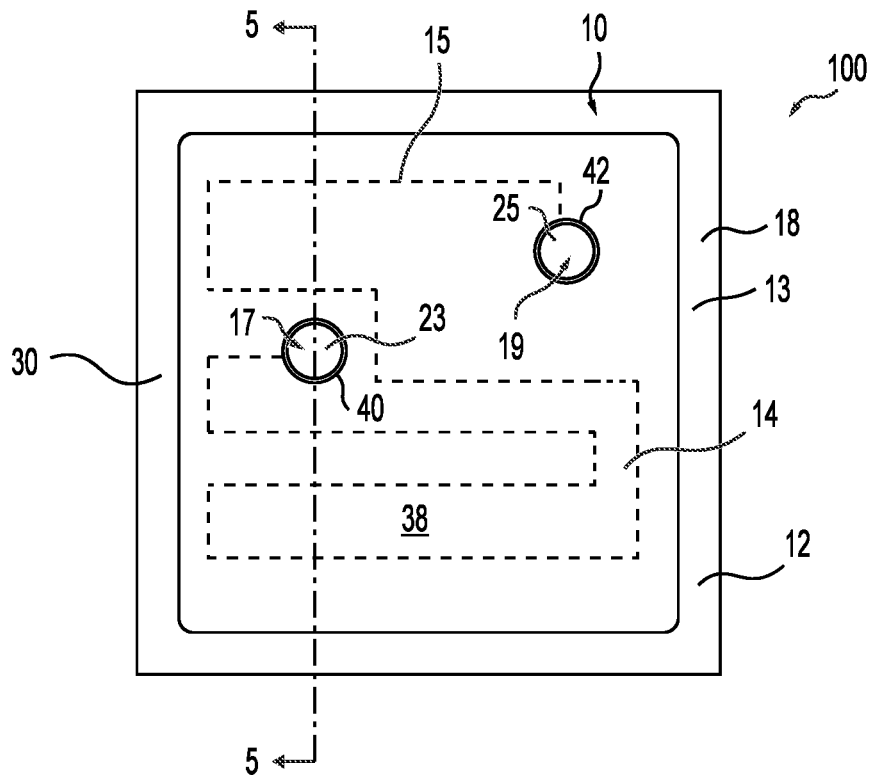
FIG. 3 is a top plan view of the liquid cooling assembly of FIG. 1.
Figure 4:
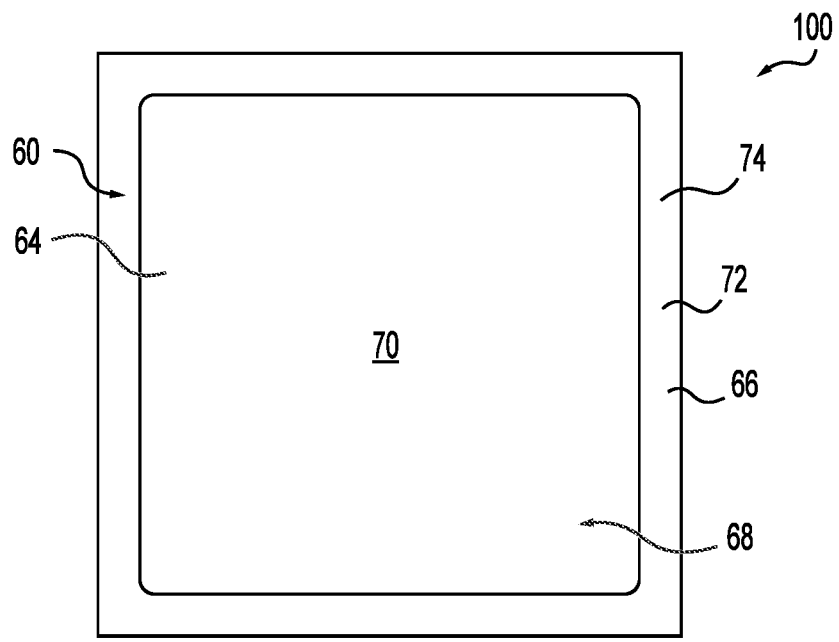
FIG. 4 is a bottom plan view of the liquid cooling assembly of FIG. 1.

In this embodiment, the cover 14 is a plate member that is generally planar and shaped to be received within the pocket 32. The cover 14 has an upper (outer) surface 36 and a lower (inner) surface 38 on opposite sides of the cover 14. As shown in FIG. 3, in this embodiment, the cover 14 defines an inlet opening 23 and an outlet opening 25 which extend from the upper surface 36 to the lower surface 38. The inlet and outlet openings 23, 25 correspond to the inlet 17 and the outlet 19 of the liquid cooling block 10 respectively. As such, cooling fluid is respectively fed into and discharged from the internal fluid conduit 15 through the inlet opening 23 and the outlet opening 25 of the cover 14. Inlet and outlet ducts 40, 42 are connected to the cover 14 at the inlet and outlet openings 23, 25 respectively to fluidly connect the internal fluid conduit 15 to an external cooling fluid source. For example, in a data center, the external cooling fluid source may comprise a circuit of cooling equipment including one or more dry coolers installed outside of the data center. As such, during use, in this embodiment, cooling fluid is continuously recirculated between the external cooling fluid source and the liquid cooling block 10.

As shown in FIG. 5, the cover 14 is received in the pocket 32 of the base 12 with the lower surface 36 of the cover 14 facing the upper base surface 28. In particular, the lower surface 36 is placed in contact with the upper base surface 28. The internal fluid conduit 15 of the liquid cooling block 10 is thus defined by the lower surface 36 of the cover 14 and the channel 34 of the base 12. It is contemplated that, in some embodiments, the cover 14 could define a channel in the lower surface 36 complementary to the channel 34 of the base 12. Moreover, in other embodiments, the channel 34 could be omitted from the base 12 and the cover 14 could define the channel instead.

In this embodiment, the cover 14 has a thickness approximately equal to a height of the retaining lip section 30 such that, when the cover 14 is in place in the pocket 32, an upper (outer) surface 38 of the cover 14 is generally flush with the upper surface of the retaining lip section 30. Furthermore, in this embodiment, the cover 14 is welded to the base 12 along a periphery of the cover 14. For instance, the cover 14 may be laser welded to the base 12. The relatively small periphery of the cover 14 is helpful for limiting a temperature increase of the cover 14 and the base 12 during welding. Notably, welding the cover 14 to the base 12 generally increases the temperature of the cover 14 and the base 12 and therefore, providing a cover with a greater periphery would increase the amount of time to which the cover 14 and the base 12 are exposed to increased temperatures which could result in deformation of the cover 14 and/or the base 12.

With continued reference to FIGS. 1 to 7, the liquid cooling assembly 100 will now be described in greater detail. The liquid cooling assembly 100 includes the liquid cooling block 10 as previously described and a heat spreading base 60 that at least partly receives the liquid cooling block 10. The heat spreading base 60 is configured to be positioned between the liquid cooling block 10 and the heat-generating electronic component 50 such that, in use, heat is transferred from the heat-generating electronic component 50 to the heat spreading base 60 and subsequently to the liquid cooling block 10.

In this embodiment, the heat spreading base 60 has a base body 62 which has substantially the same configuration as the base 12 of the liquid cooling block 10. Notably, the base body 62 has a lower portion 64 and an upper portion 66 disposed above the lower portion 64.

Figure 2:
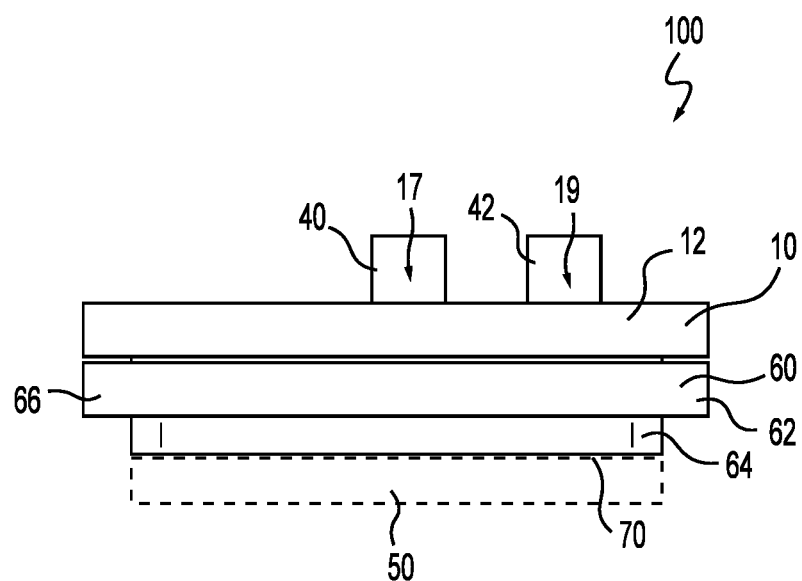
FIG. 2 is a right side elevation view of the liquid cooling assembly of FIG. 1, shown installed on a heat-generating electronic component.

The lower portion 64 has a periphery that is smaller than a periphery of the upper portion 66 and, as such, the upper portion 66 forms a peripheral shoulder 72 that extends outwardly from an upper end of the lower portion 64. The peripheral shoulder 72 defines a shoulder surface 74 on a lower side 68 of the base body 62. The lower portion 64 is also positioned generally centrally relative to the upper portion 66. In this embodiment, the lower portion 64 is generally square. The lower portion 64 defines a thermal contact surface 70 of the heat spreading base 60, the thermal contact surface 70 being disposed on the lower side 68 of the base body 62. As shown in FIG. 2, the thermal contact surface 70 is configured to be placed in thermal contact with the heat-generating electronic component 50. As such, the thermal contact surface 70 is the surface of the heat spreading base 60 through which heat is primarily transferred to the heat spreading base 60.

The upper portion 66 of the base body 62 defines an upper base surface 76 accessible from an upper side 69 of the base body 62. The upper portion 66 also includes a retaining lip section 78 which extends upward from the upper base surface 76 and is disposed peripherally around the base surface 76. As such, a pocket 80 is defined by the upper base surface 76 and the retaining lip section 78. The pocket 80 is shaped and dimensioned to at least partly receive the base 12 of the liquid cooling block 10. Notably, in this embodiment, the pocket 80 is generally square to correspond to the square shape of the lower portion 16 of the base 12 of the liquid cooling block 10. Indeed, in this embodiment, the retaining lip section 78 has four inner surfaces 79 forming the square shape of the pocket 80.

As will be appreciated, unlike the upper base surface 28 of the liquid cooling block 10, the upper base surface 76 does not define a channel like the channel 34 of the base 12. Thus, in this embodiment, the base body 62 is identical to the base 12 of the liquid cooling block 10 with the exception of the channel 34 which is omitted from the base body 62. As such, in this embodiment, the base body 62 is formed in the same manner as the base 12. In particular, in this embodiment, the base body 62 is also formed by punching. As will be described in greater detail below, these similarities between the base 12 and the heat spreading base 60 can further simplify the manufacturing of the liquid cooling assembly 100.

Figure 6:
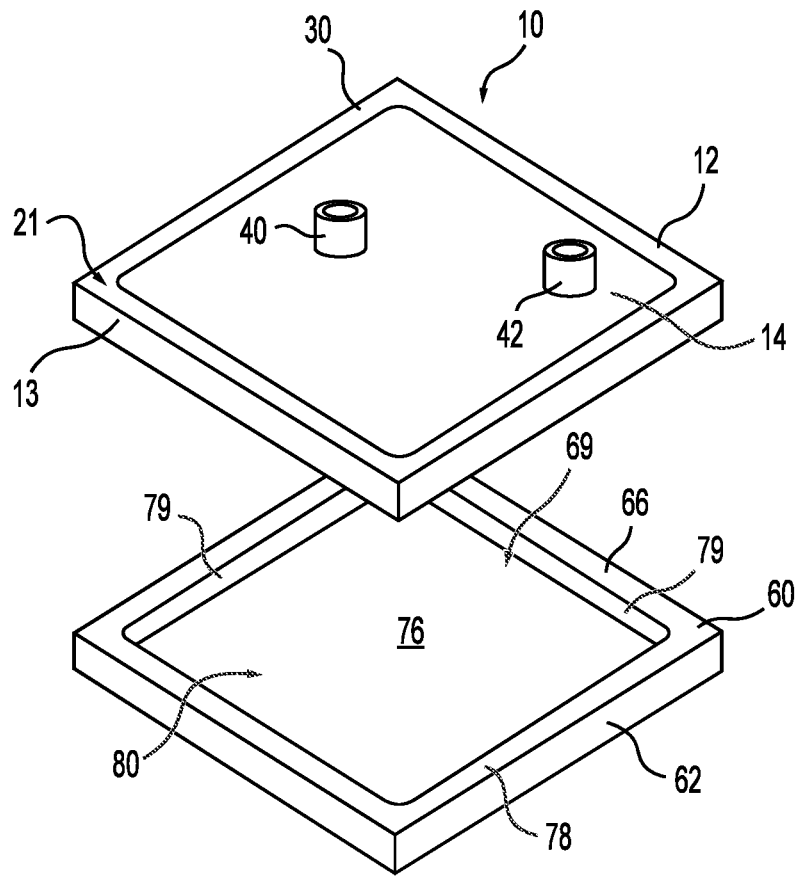
FIG. 6 is a perspective view, taken from a top, front, right side, of the liquid cooling assembly of FIG. 1 shown in a partially exploded configuration.

With reference to FIGS. 6 and 7, the liquid cooling assembly 100 is formed by mating the liquid cooling block 10 with the heat spreading base 60. More specifically, the lower portion 16 of the liquid cooling block 10 is inserted into the pocket 80 defined by the heat spreading base 60. To that end, the pocket 80 is shaped and dimensioned such that, when the lower portion 16 is inserted therein, the inner surfaces 79 of the retaining lip section 78 defining the pocket 80 and the outer surfaces 29 of the lower portion 16 are in a close fit such that the lower portion 16 is insertable into and removable from the pocket 80 by hand. The retaining lip section 78 of the heat spreading base 60 thus surrounds the lower portion 16 of the liquid cooling block 10 and thereby limits movement of the liquid cooling block 10 relative to the heat spreading base 60 along horizontal directions (e.g., frontwardly, rearwardly and laterally).

Once the liquid cooling block 10 is received by the heat spreading base 60, the thermal contact surface 22 of the liquid cooling block 10 is in contact with the upper base surface 76 of the heat spreading base 60. As such, in use, when the liquid cooling assembly 100 is installed on the heat-generating electronic component 50, heat is transferred from the heat-generating electronic component 50 to the heat spreading base 60 through the thermal contact surface 70 of the heat spreading base 60, with a thermal interface material disposed between the thermal contact surface 70 and the heat-generating electronic component 50. Subsequently, heat is transferred, at least primarily, from the heat spreading base 60 to the liquid cooling block 10 via the upper base surface 76 of the heat spreading base 60 and the thermal contact surface 22 of the liquid cooling block 10 which are mated with one another. The heat transferred to the liquid cooling block 10 is then absorbed by the cooling fluid circulating in the internal fluid conduit 15. The heated cooling fluid is discharged through the outlet 42 of the liquid cooling block 10 and is replaced by cooled cooling fluid entering the liquid cooling block 10 through the inlet 40. This process repeats continuously during use.

As will be appreciated, in the liquid cooling assembly 100, the thermal contact surface 22 of the liquid cooling block 10 and the thermal contact surface 70 of the heat spreading base 60 have the same surface area (within acceptable manufacturing tolerances). Nevertheless, the presence of the heat spreading base 60 favors a greater uniformity of heat along the thermal contact surface 22 of the liquid cooling block 10 than might otherwise be feasible if the thermal contact surface 22 of the liquid cooling block 10 were directly mated with the heat-generating electronic component 50 without the intervening heat spreading base 60. Indeed, by providing the heat spreading base 60, heat is spread out horizontally in the heat spreading base 60 before being transferred to the liquid cooling block 10. The more uniform heat distribution along the thermal contact surface 22 of the liquid cooling block 10 results in more efficient cooling by the liquid cooling block 10 despite some thermal resistance being posed by the material of the heat spreading base 60. This may be particularly advantageous for instance in cases where the heat-generating electronic component 50 produces a significant amount of heat per unit surface area, such as newer more power dense CPUs.

As mentioned above, the similarities between the heat spreading base 60 and the base 12 of the liquid cooling block 10 can simplify the manufacturing of the liquid cooling assembly 100. Notably, in accordance with an embodiment, a method for manufacturing the liquid cooling assembly 100 includes producing multiple copies of the base body 62 and selecting one of the base bodies 62 to form the liquid cooling block 10 while another one of the base bodies 62 is selected to use as the heat spreading base 60. Indeed, as explained above, the base body 62 is identical to the "base body" 12 except that the base body 62 does not include the channel 34. In other words, prior to forming the channel 34 in the upper base surface 28 of the base body 12, the base bodies 12, 62 are identical to one another and are thus interchangeable. Therefore, the base body 62 which was selected to form the liquid cooling block 10 is modified to form the channel 34, thereby obtaining the base 12 as described above. In this embodiment, the channel 34 is formed by milling the channel 34 into the upper base surface 28. Next, the cover 14 is affixed to the base 12 (i.e., the base body that was selected to form the liquid cooling block 10) to form the liquid cooling block 10. In particular, in this embodiment, the cover 14 is laser welded to the base 12 along the periphery of the cover 14. The lower portion 16 of the now formed liquid cooling block 10 is then inserted into the pocket 80 of the heat spreading base 60 such that the thermal contact surface 22 of the lower portion 16 is in thermal contact with the upper base surface 76 of the heat spreading base 60. Prior to the insertion of the lower portion 16 into the pocket 80, a thermal interface material may be applied on one or both of the thermal contact surface 22 and the upper base surface 76.

The thermal interface material improves heat transfer between the heat spreading base 60 and the liquid cooling block 10 by ensuring continuity of contact between the thermal contact surface 22 and the upper base surface 76. Without limitations, the thermal interface material can be a thermal paste, a thermal pad, a graphite sheet, or any other compressible metal interface.

As will be appreciated from the above, the similarities between the heat spreading base 60 and the base 12 of the liquid cooling block 10 can ease requirements on the supply chain needed to form the liquid cooling assembly 100. In particular, a single component can be manufactured serially and used both as part of the liquid cooling block 10 and as the heat spreading base 60 for assembling various liquid cooling assemblies 100.

The liquid cooling assembly 200 will now be described with reference to FIGS. 8 to 11.

As mentioned above, the liquid cooling assembly 200 also includes the liquid cooling block 10 that is used to assemble the liquid cooling assembly 100. However, a number of the liquid cooling blocks 10 used in the liquid cooling assembly 200 is greater than the number of the liquid cooling blocks 10 used in the liquid cooling assembly 100. More specifically, the liquid cooling assembly 200 includes two of the liquid cooling blocks 10 and a heat spreading base 160 that at least partly receives the two liquid cooling blocks 10. The heat spreading base 160 is configured to be positioned between the two liquid cooling blocks 10 and the heat-generating electronic component 50' such that, in use, heat is transferred from the heat-generating electronic component 50' to the heat spreading base 160 and subsequently to the liquid cooling blocks 10.

Figure 10:
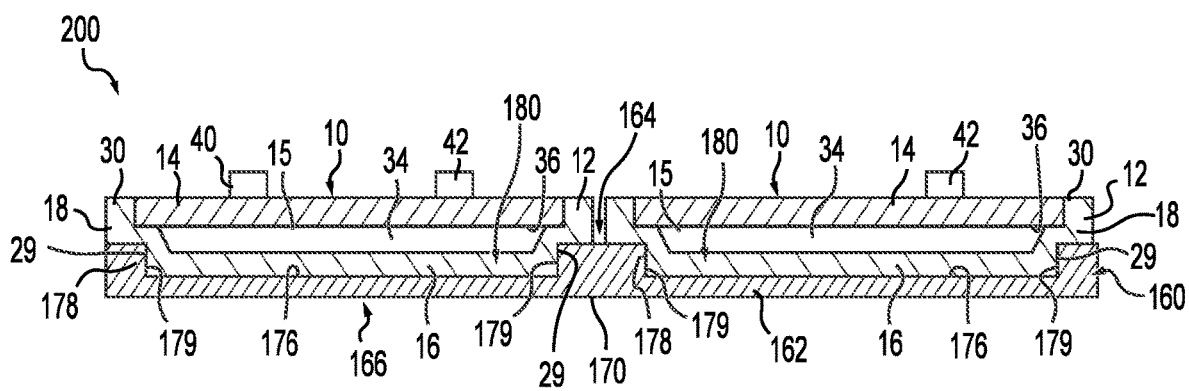
FIG. 10 is a cross-sectional view of the liquid cooling assembly of FIG. 8 taken along line 10-10 in FIG. 8.
Figure 11:
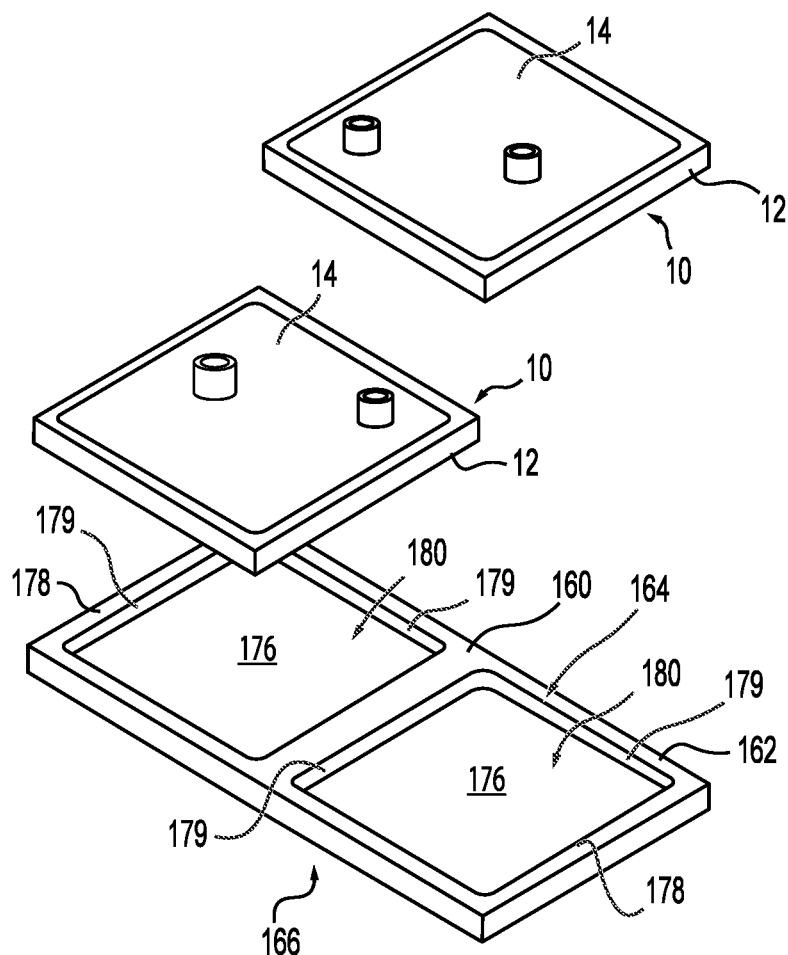
FIG. 11 is a perspective view, taken from a top, front, right side, of the liquid cooling assembly of FIG. 8 in a partially exploded configuration.

As best shown in FIGS. 10 and 11, the heat spreading base 160 has a base body 162 having an upper side 164 and a lower side 166 opposite the upper side 164. The base body 162 defines a thermal contact surface 170 of the heat spreading base 160 on the lower side 166 of the heat spreading base 160. In this embodiment, the thermal contact surface 170 is generally rectangular. The thermal contact surface 170 is configured to be placed in thermal contact with the heat-generating electronic component 50' (with a thermal interface material disposed therebetween). As such, the thermal contact surface 170 is the surface of the heat spreading base 160 through which heat is primarily transferred to the heat spreading base 160. As will be appreciated, the thermal contact surface 170 has a greater surface area than the thermal contact surface 70 of the heat spreading base 60. The base body 162 also has two upper base surfaces 176 on the upper side 164 thereof. The base body 162 also includes two retaining lip sections 178 extending upward from the upper base surface 176 and surrounding respective ones of the upper base surface 176. As such, the heat spreading base 160 defines two pockets 180, each pocket 180 being defined by one of the base surfaces 176 and a respective retaining lip section 178. The pockets 180 are shaped and dimensioned to at least partly receive the bases 12 of the liquid cooling blocks 10.

As shown in FIG. 11, the liquid cooling assembly 200 is formed by mating the two liquid cooling blocks 10 thereof with the heat spreading base 160. More specifically, the lower portions 16 of the liquid cooling blocks 10 are inserted into the corresponding pockets 180 of the heat spreading base 160. To that end, each pocket 180 is shaped and dimensioned such that, when the lower portion 16 of the respective liquid cooling block 10 is inserted therein, the inner surfaces 179 of the retaining lip section 178 defining the pocket 180 and the outer surfaces 29 of the lower portion 16 are in a close fit such that the lower portion 16 is insertable into and removable from the pocket 180 by hand. The retaining lip sections 178 of the heat spreading base 160 thus surround the lower portions 16 of the corresponding liquid cooling blocks 10 and thereby limit movement thereof relative to the heat spreading base 160 in horizontal directions (e.g., frontwards, backwards and laterally). Prior to the insertion of the lower portions 16 into the corresponding pockets 180, a thermal interface material may be applied on one or both of each of the thermal contact surfaces 22 and the upper base surfaces 176.

As will be appreciated from the above, in order to assemble one of the liquid cooling assemblies 100, 200 of the family of liquid cooling assemblies, the correct number of liquid cooling blocks 10 is selected for mating with one of the heat spreading bases 60, 160 to form the corresponding one of the liquid cooling assemblies 100, 200. Notably, in this embodiment, when the liquid cooling assembly 100 is being assembled to cool the heat-generating electronic component 50, a single one of the liquid cooling blocks 10 is selected to mate with the heat spreading base 60. On the other hand, when the liquid cooling assembly 200 is being assembled to cool the heat-generating electronic component 50', two of the liquid cooling blocks 10 are selected to mate with the heat spreading base 160. Once the number of liquid cooling blocks 10 has been selected, the liquid cooling block(s) 10 is/are partly inserted into the pockets 80, 180 of the corresponding heat spreading base 60, 160 such that the thermal contact surface(s) 22 of the liquid cooling block 10 is/are in contact with the upper base surface 76 of the heat spreading base 60 or the upper base surfaces 176 of the heat spreading base 160.

While in the above-described embodiments, the heat spreading bases 60, 160 have one and two pockets 80, 180 respectively, it is to be understood that the number of pockets 80, 180 may vary in different embodiments. For instance, in some embodiments, the heat spreading base 60 could define two pockets while the heat spreading base 160 defines three pockets. In other words, the number of pockets 180 of the heat spreading base 160 is simply greater than the number of pockets 80 of the heat spreading base 60 (while the number of pockets 80 is at least one) such that the two liquid cooling assemblies 100, 200 differ in the amount of liquid cooling blocks 10 used.

Therefore, as will be appreciated, the two liquid cooling assemblies 100, 200 are suitable for cooling heat-generating electronic components 50, 50' of different sizes and yet both the liquid cooling assemblies 100, 200 implement the same model of the liquid cooling block 10 to achieve this function. As will be understood, this can result in significant economies for an operator (e.g., a data center operator) since the production of only a single model of liquid cooling block 10 needs to be ensured to assemble both of the liquid cooling assemblies 100, 200.

It is contemplated that a method for manufacturing the liquid cooling assembly 100 in accordance with some non-limiting implementations of the present technology can be represented as presented in the follow numbered clauses.

CLAUSE 1. A method for manufacturing a liquid cooling assembly, comprising: producing a first base body and a second base body, each of the first and second base bodies comprising: an upper base surface on an upper side of the base body; a retaining lip section extending upward from the upper base surface, the retaining lip defining a pocket together with the upper base surface; a lower portion defining a thermal contact surface on a lower side of the base body, the lower portion defining a lower periphery; and an upper portion disposed above the lower portion and extending outwardly therefrom, the upper portion defining an upper periphery, the upper periphery being greater than the lower periphery; selecting either one of the first base body and the second base body to form a liquid cooling block therewith; forming a channel in the upper base surface of the selected one of the first base body and the second base body; affixing a cover to the selected one of the first base body and the second base body to form the liquid cooling block, an internal fluid conduit of the liquid cooling block being defined between the channel of the selected one of the first base body and the second base body and a lower surface of the cover; and inserting the lower portion of the selected one of the first base body and the second base body into the pocket of an other one of the first base body and the second base body such that the thermal contact surface of the selected one of the first base body and the second base body is in thermal contact with the upper base surface of the other one of the first base body and the second base body, the thermal contact surface of the other one of the first base body and the second base body being configured to be in thermal contact with a heat-generating electronic component.

CLAUSE 2. The method of clause 1, wherein, prior to forming the channel in the upper base surface of the selected one of the first base body and the second base body, the first base body and the second base body are identical to one another such as to be interchangeable.

CLAUSE 3. The method of clause 1 or 2, further comprising applying a thermal interface material on at least one of the thermal contact surface of the selected one of the first base body and the second base body and the upper base surface of the other one of the first base body and the second base body.

CLAUSE 4. The method of any one of clauses 1 to 3, wherein affixing the cover to the selected one of the first base body and the second base body comprises welding the cover to the selected one of the first base body and the second base body.

CLAUSE 5. The method of any one of clauses 1 to 4, wherein forming the channel comprises milling the channel in the upper base surface of the selected one of the first base body and the second base body.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A method for assembling a liquid cooling assembly of a family of liquid cooling assemblies, including at least a first liquid cooling assembly and a second liquid cooling assembly, the method comprising:

providing a plurality of liquid cooling blocks, each of the liquid cooling blocks defining an internal fluid conduit for circulation of a cooling fluid therethrough, each of the liquid cooling blocks having a block thermal contact surface, the block thermal contact surface of each of the liquid cooling blocks having a same surface area;

providing a first heat spreading base having a first thermal contact surface on a lower side of the first heat spreading base, the first thermal contact surface being configured to be in thermal contact with a first heat-generating electronic component, the first heat spreading base defining at least one first pocket on an upper side thereof;

providing a second heat spreading base having a second thermal contact surface on a lower side of the second heat spreading base, the second thermal contact surface being configured to be in thermal contact with a second heat-generating electronic component, the second heat spreading base defining a plurality of second pockets on an upper side thereof, the second thermal contact surface having a surface area that is greater than a surface area of the first thermal contact surface such that the first and the second thermal contact surfaces are adapted to be mounted on the first and the second heat-generating electronic components respectively, a number of the second pockets being greater than a number of the at least one first pocket;

when assembling the first liquid cooling assembly:
selecting at least one liquid cooling block of the plurality of liquid cooling blocks to mate with the first heat spreading base in order to form the first liquid cooling assembly suitable for cooling the first heat-generating electronic component; and inserting the selected at least one liquid cooling block at least partly into a corresponding one of the at least one first pocket of the first heat spreading base, the block thermal contact surface of each of the selected at least one liquid cooling block being in contact with an upper base surface of the first heat spreading base defining the corresponding one of the at least one first pocket; and when assembling the second liquid cooling assembly:
selecting at least two liquid cooling blocks of the plurality of liquid cooling blocks to mate with the second heat spreading base in order to form the second liquid cooling assembly suitable for cooling the second heat-generating electronic component; and inserting each of the selected at least two liquid cooling blocks at least partly into a corresponding one of the second pockets of the second heat spreading base, the block thermal contact surface of each of the selected at least two liquid cooling blocks being in contact with an upper base surface of the second heat spreading base defining the corresponding one of the second pockets.

2. The method of claim 1, wherein:
each of the liquid cooling blocks has a lower portion defining the block thermal contact surface thereof;

when assembling the first liquid cooling assembly, inserting the selected at least one liquid cooling block comprises inserting the lower portion of the selected at least one liquid cooling block into the at least one first pocket; and when assembling the second liquid cooling assembly, inserting the selected at least two liquid cooling blocks comprises inserting the lower portions of the selected at least two liquid cooling blocks into the second pockets.

3. The method of claim 1, further comprising:
when assembling the first liquid cooling assembly, applying a thermal interface material on at least one of: (i) each upper base surface defining the at least one first pocket of the first heat spreading base, and (ii) the block thermal contact surface of each of the selected at least one liquid cooling block; and when assembling the second liquid cooling assembly, applying a thermal interface material on at least one of: (i) each upper base surface defining the corresponding one of the second pockets of the second heat spreading base, and (ii) the block thermal contact surface of each of the selected at least two liquid cooling blocks.

4. The method of claim 1, wherein the at least one first pocket and the second pockets are sized to closely fit part of each of the liquid cooling blocks.

5. The method of claim 1, wherein:
the first heat spreading base is generally square; and
the second heat spreading base is generally rectangular.

6. The method of claim 1, wherein the at least one first pocket is a single first pocket.

7. The method of claim 1, wherein the plurality of second pockets is two second pockets.

8. The method of claim 1, wherein the liquid cooling blocks are identical to one another.

9. The method of claim 1, wherein each of the liquid cooling blocks comprises a base and a cover connected thereto, the internal fluid conduit of each of the liquid cooling blocks being defined between the base and the cover thereof.

10. The method of claim 1, wherein the surface area of the second thermal contact surface is at least two times greater than the surface area of the first thermal contact surface.

11. A system for assembling a liquid cooling assembly of a family of liquid cooling assemblies, including at least a first liquid cooling assembly and a second liquid cooling assembly, the system comprising:

a plurality of liquid cooling blocks, each of the liquid cooling blocks defining an internal fluid conduit for circulation of a cooling liquid therethrough, each of the liquid cooling blocks having a block thermal contact surface, the block thermal contact surfaces of the liquid cooling blocks having a same surface area;

a first heat spreading base having a first thermal contact surface on a lower side of the first heat spreading base, the first thermal contact surface being configured to be in thermal contact with a first heat-generating electronic component, the first heat spreading base defining at least one first pocket on an upper side thereof; and a second heat spreading base having a second thermal contact surface on a lower side of the second heat spreading base, the second thermal contact surface being configured to be in thermal contact with a second heat-generating electronic component, the second heat spreading base defining a plurality of second pockets on an upper side thereof, the second thermal contact surface having a surface area that is greater than a surface area of the first thermal contact surface such that the first and the second thermal contact surfaces are adapted to be mounted on the first and the second heat-generating electronic components respectively, a number of the second pockets being greater than a number of the at least one first pocket;

wherein, when the first liquid cooling assembly is assembled:
  at least one liquid cooling block of the plurality of liquid cooling blocks is at least partly received within a respective one of the at least one first pocket defined by the first heat spreading base; and
  the block thermal contact surface of each of the at least one liquid cooling block is in thermal contact with an upper base surface of the first heat spreading base defining a corresponding one of the at least one first pocket; and
wherein, when the second liquid cooling assembly is assembled:
  at least two liquid cooling blocks of the plurality of liquid cooling blocks are at least partly received within respective ones of the second pockets defined by the second heat spreading base; and
  the block thermal contact surface of each of the at least two liquid cooling blocks is in thermal contact with an upper base surface of the second heat spreading base defining a corresponding one of the second pockets.

12. The system of claim 11, wherein:
  each of the liquid cooling blocks comprises a lower portion defining the block thermal contact surface thereof and an upper portion, a periphery of the lower portion being smaller than a periphery of the upper portion;
  when the first liquid cooling assembly is assembled, the lower portion of each of the at least one liquid cooling block is received in the respective one of the at least one first pocket; and
  when the second liquid cooling assembly is assembled, the lower portion of each of the at least two liquid cooling blocks is received within a respective one of the second pockets.

13. The system of claim 11, wherein the at least one first pocket and the second pockets are sized to closely fit part of each of the liquid cooling blocks.

14. The system of claim 11, wherein the at least one first pocket is a single first pocket.

15. The system of claim 11, wherein the surface area of the second thermal contact surface is at least two times greater than the surface area of the first thermal contact surface.

* * * * *